(12) United States Patent
Chern et al.

(10) Patent No.: US 8,217,729 B2
(45) Date of Patent: Jul. 10, 2012

(54) INTEGRATED CIRCUITS INCLUDING AN LC TANK CIRCUIT AND OPERATING METHODS THEREOF

(75) Inventors: Chan-Hong Chern, Palo Alto, CA (US); Fu-Lung Hsueh, Cranbury, NJ (US); Chiang Pu, San Jose, CA (US); Chih-Chang Lin, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 67 days.

(21) Appl. No.: 12/706,825

(22) Filed: Feb. 17, 2010

(65) Prior Publication Data
US 2011/0199063 A1 Aug. 18, 2011

(51) Int. Cl.
*H03B 5/08* (2006.01)

(52) U.S. Cl. ............... 331/167; 331/117 R; 331/117 FE

(58) Field of Classification Search ..................... 331/16, 331/74, 175
See application file for complete search history.

(56) References Cited

U.S. PATENT DOCUMENTS 7,859,355 B2 * 12/2010 Brennan et al. ............... 331/183
7,978,017 B2 * 7/2011 Pernia et al. .................. 331/167

* cited by examiner

*Primary Examiner* — Arnold Kinkead
(74) *Attorney, Agent, or Firm* — Lowe Hauptman Ham & Berner, LLP

(57) ABSTRACT

An integrated circuit includes an inductor-capacitor (LC) tank circuit coupled with a feedback loop. The LC tank circuit is configured to output an output signal having a peak voltage that is substantially equal to a direct current (DC) voltage level plus an amplitude. The feedback loop is capable of determining if the peak voltage of the output signal falls within a range between a first voltage level and a second voltage level for adjusting the amplitude of the output signal.

16 Claims, 3 Drawing Sheets

INTEGRATED CIRCUITS INCLUDING AN LC TANK CIRCUIT AND OPERATING METHODS THEREOF

TECHNICAL FIELD

The present disclosure relates generally to the field of semiconductor circuits, and more particularly, to integrated circuits including an LC tank circuit and operating methods thereof.

BACKGROUND

Phase locked loops (PLLs) are widely used in electronic designs such as radios, television receivers, video apparatuses, satellite broadcasts and instrumentation systems. PLLs are electronic circuits with a voltage (VCO) or current-controlled oscillator (CCO) that is constantly driven to match the frequency of an input signal. For low phase noise performance, Inductor-Capacitor (LC) type of Voltage Controlled Oscillator (LCVCO or LC-tank VCO) is used. Intrinsically, the LC-type VCOs have a small frequency tuning range. To combat process variations and to cover a wide range of frequency operations, a series of capacitor banks are needed to increase the tuning range as well as the frequency coverage range. However, parasitic capacitances from interconnect wires for connecting capacitor banks degrade the tuning range and the total frequency coverage range and need to be minimized. Minimizing the interconnect capacitance, however, results in increasing the parasitic resistances that will increase the loss of the LC-tank VCO. Therefore, LCVCO designers will need to choose an optimal interconnect wire width to make sure that the LCVCO has an enough frequency coverage range and tuning range and at the same time does not have an excessive loss that causes the LCVCO failing to oscillate. Once the parasitic capacitance is designed in, designers can only budget a certain amount of design guardband based on the worst-case interconnect resistance variations spec from the spice model. If the actual silicon interconnect resistance shifts much more than the worst-case variation spec, the LCVCO will not be able to oscillate. Similarly, the LCVCO active devices, normally a pair of cross-coupled N-channel Metal Oxide Semiconductor (NMOS) devices or a pair of cross-coupled P-channel Metal Oxide Semiconductor (PMOS) devices, have parasitic capacitances that reduce the LCVCO frequency coverage and tuning ranges and need to be reduced. The gain of the active devices is controlled to compensate the loss of the LCVCO from the parasitic resistances. Therefore, one has to make the active devices large enough to have a sufficient gain but on the other hand has to make the active devices small enough to minimize their parasitic capacitances. Again, an optimal point (active devices sizes) needs to be chosen. If the gain of the active devices in the actual silicon is much smaller than the worst-case Spice model spec, the LCVCO will not be able to oscillate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
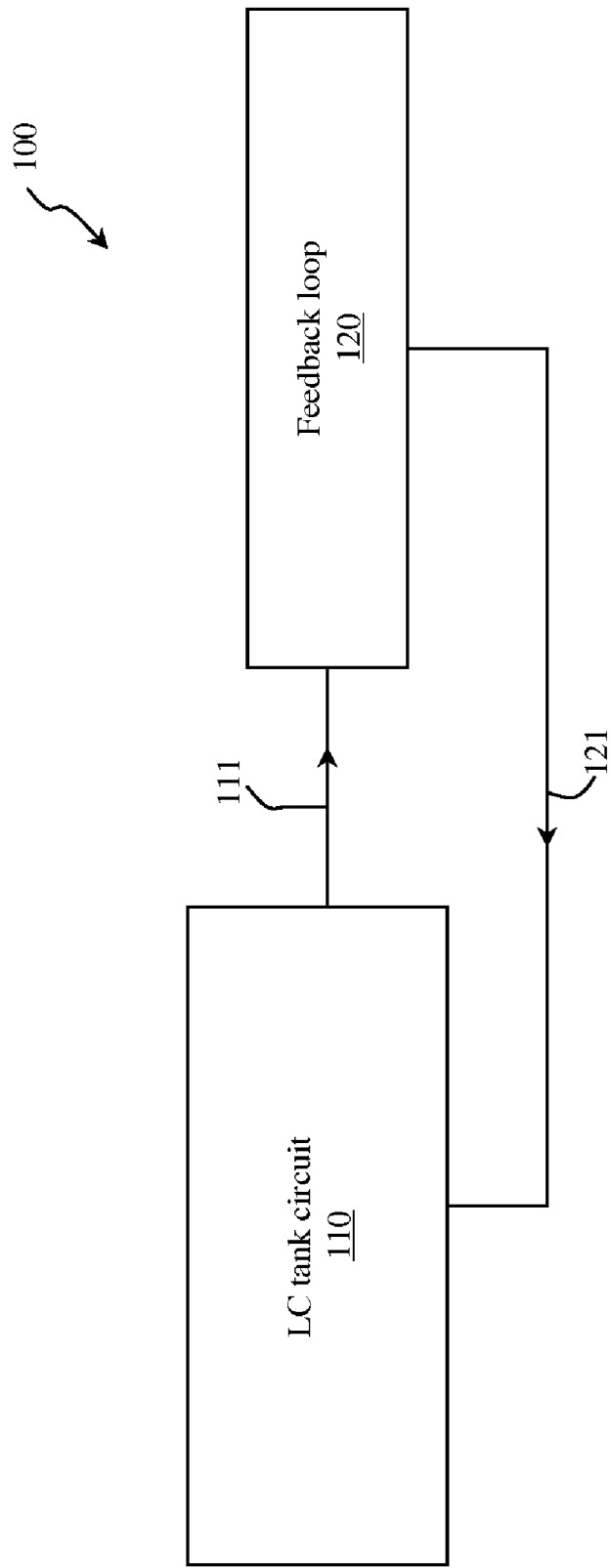
FIG. 1 is a schematic drawing illustrating an exemplary integrated circuit including an inductor-capacitor (LC) tank circuit.

Conventionally, a PLL circuit includes either a ring-type voltage or current-controlled oscillator or an inductor-capacitor voltage control oscillator (LCVCO) that tunes a circuit frequency close to a desired frequency. The conventional LCVCO has an LC tank. The LC tank is subjected to process variations, e.g., variations of parasitic interconnect resistances. In order to have an enough quality factor of the LC tank so to make the LC tank oscillate, a pair of cross-coupled NMOS or PMOS devices are added to provide enough gain for the LCVCO. Therefore, the LCVCO is also subjected to transistors' gains variations. The variations may undesirably affect the output amplitude and frequency of the conventional LCVCO. The worst scenario that may happen is that the LCVCO can not even oscillate.

Several approaches have been proposed to combat the process variation impacts to the LCVCO performance and functionality. One of them is provided to reduce a parasitic interconnect resistance of the LC tank by increasing the width of interconnect metal lines of the LC tank. However, the increase of the width of the interconnection metallic lines also increases undesired parasitic capacitances of the LC tank. Undesired parasitic capacitances reduce LCVCO frequency coverage range and tuning range. Additionally, this approach may not be sufficient to warrant LC tank oscillation upon wider than spec spice model process variations and/or voltage/temperature variations.

Another approach is proposed to merely increase the gain of cross-coupled transistors coupled with the LC tank. It is found that the LCVCO may still fail to oscillate if silicon variations of the interconnect resistance and cross-coupled transistors are more serious than that of the process variation spec. It is also found that the common mode voltage of the output signal of the LCVCO may shift and adversely affect the operation of a circuit that receives the output signal as well as degrade the operation headroom of the LCVCO itself.

In still another approach, a total tail current flowing through the cross-coupled transistors is manually adjusted so as to increase the gain of the cross-coupled transistors. However, the manual adjustment of the tail current is finite and discrete. Additionally, the manual adjustment of the tail current may not be able to adequately compensate the loss of the LCVCO from excessive interconnect resistance variations if the preset total tail current is not sufficient.

Based on the foregoing, integrated circuits including an LC tank with an automatic loss compensation scheme and operating methods thereof are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Embodiments of the present disclosure are directed to integrated circuits including an LC tank circuit and methods for operating the integrated circuit. By determining the peak voltage of an output signal outputted from the LC tank circuit, a feedback loop can automatically adjust the gain of the LCVCO cross-coupled devices so to adjust the amplitude of the output signal. By adjusting the gain of the LCVCO cross-coupled devices, the LC tank loss can be desirably compensated. Following are descriptions of exemplary embodiments regarding the integrated circuit and operating methods thereof. The scope of the present disclosure is not limited thereto.

FIG. 1 is a schematic drawing illustrating an exemplary integrated circuit including an inductor-capacitor (LC) tank circuit. In FIG. 1, an integrated circuit 100 can include an inductor-capacitor (LC) tank circuit 110 coupled with a feedback loop 120. The LC tank circuit 110 is capable of outputting an output signal 111 having a peak voltage. The peak voltage is substantially equal to an amplitude plus a direct current (DC) voltage value. The feedback loop 120 is capable of determining if the peak voltage of the output signal 111 falls within a range between a first voltage level and a second voltage level. Based on the determination, the feedback loop 120 may output a signal 121 for adjusting the amplitude of the output signal 111.

Figure 2:
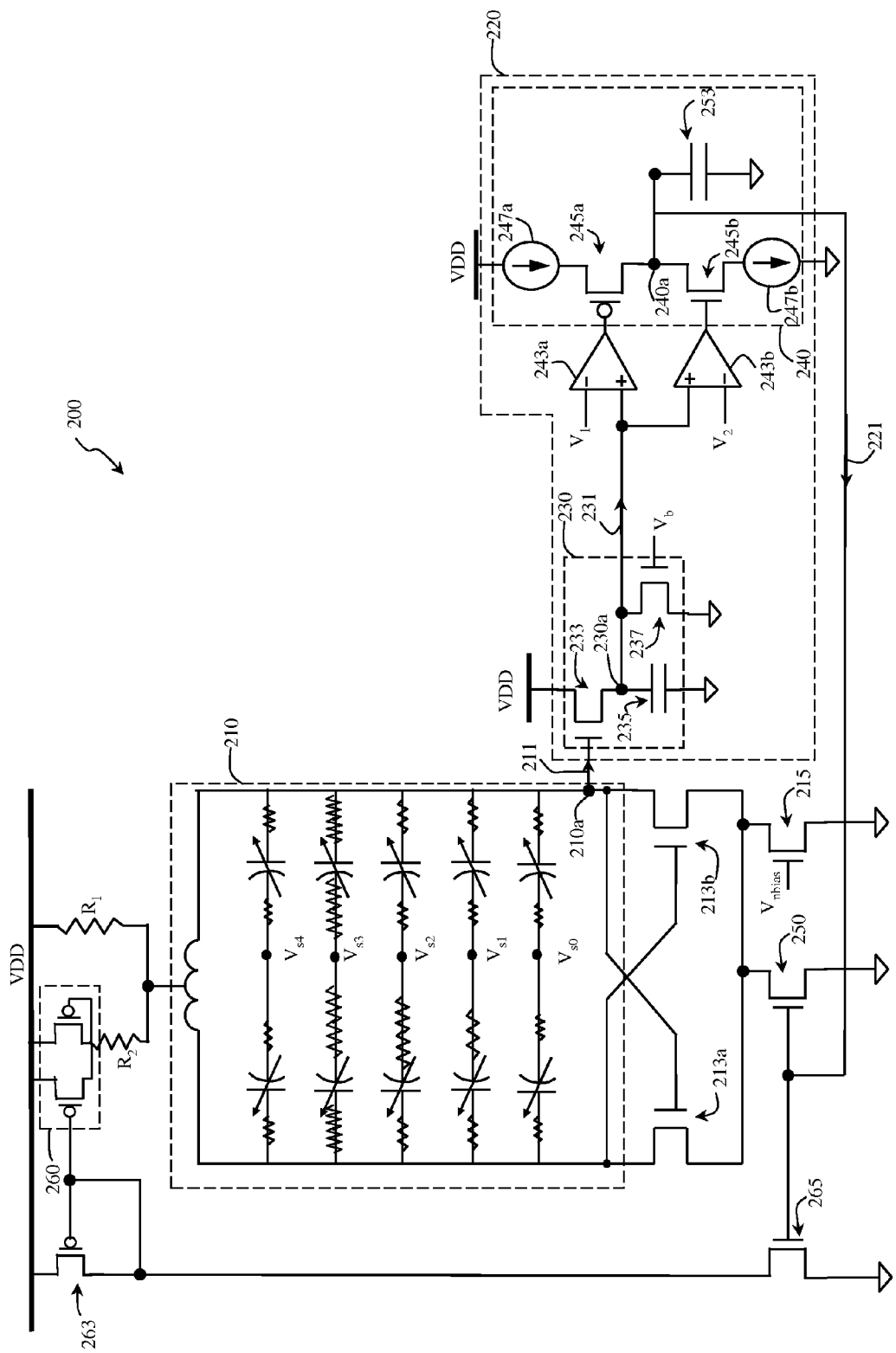
FIG. 2 is a schematic drawing illustrating another exemplary integrated circuit including an inductor-capacitor (LC) tank circuit.

FIG. 2 is a schematic drawing illustrating another exemplary integrated circuit including an inductor-capacitor (LC) tank circuit. Items of FIG. 2 that are the same items in FIG. 1 are indicated by the same reference numerals, increased by 100. In FIG. 2, an integrated circuit 200 can include an inductor-capacitor (LC) tank circuit 210 coupled with a feedback loop 220. In some embodiments, the integrated circuit 200 can be referred to as an inductor-capacitor voltage control oscillator (LCVCO) circuit.

In some embodiments, the LC tank circuit 210 can have at least one output end, e.g., an output end 210a. The LC tank circuit 210 is capable of outputting an output signal 211. The output signal 211 can be, for example, a sinusoidal signal having a peak voltage that is substantially equal to a direct current (DC) voltage level plus an amplitude. In some embodiments, the LC tank circuit 210 can include at least one inductor and at least one adjustable capacitor (not labeled). The LC tank circuit 210 can have at least one node (not labeled). The nodes can receive voltages, e.g., voltages $V_{s0}$-$V_{s4}$, for adjusting the capacitance of the LC tank circuit 210 for providing a desired resonant frequency. It is noted that the number and/or disposition of the nodes, inductor, and/or capacitors of the LC tank circuit 210 are merely exemplary. The scope of the present disclosure is not limited thereto.

Referring to FIG. 2, the integrated circuit 200 can include cross-coupled transistors 213a and 213b, e.g., NMOS transistors, coupled with the LC tank circuit 210. The cross-coupled transistors 213a and 213b can be coupled with a current source 215. The current source 215 can be controllable for adjusting at least a portion of the total tail current flowing through the cross-coupled transistors 213a and 213b. In some embodiments, the current source 215 can be a biased-transistor, e.g., a biased-NMOS transistor. The gate of the transistor can be coupled with a bandgap reference voltage controller (not shown). The bandgap reference voltage controller is capable of providing a bias voltage $V_{nbias}$ for adjusting at least a portion of the total tail current flowing through the cross-coupled transistors 213a and 213b. By adjusting at least a portion of the total tail current, the cross-coupled transistors 213a and 213b can provide a desired gain to compensate the LC tank loss so as to output oscillation signal 211 at the output end 210a. It is noted that the number and/or type of the cross-coupled transistors 213a-213b and the current source 215 are merely exemplary. The scope of the disclosure is not limited thereto.

Referring to FIG. 2, the integrated circuit 200 can include the feedback loop 220 coupled with the output end 210a of the LC tank circuit 210. The feedback loop 220 is capable of determining if the peak voltage of the output signal 211 falls within a range between a voltage level $V_1$ and another voltage level $V_2$ for adjusting the amplitude of the output signal 211. Based on the determination of the feedback loop 220, the feedback loop 220 may output a signal 221 for adjusting at least a portion of the total tail current. By adjusting the at least a portion of the total tail current, the loss of the LC tank circuit 210 and the oscillation amplitude of the output signal 211 at the output end 210a can be desirably adjusted.

For example, the feedback loop 220 can include a peak detector 230 coupled with at least one comparator, e.g., comparators 243a and 243b. The comparator 243a and 243b can be coupled with a charge pump circuit 240. In some embodiments, the peak detector 230 can include a transistor 233, e.g., an NMOS transistor, coupled with a capacitor 235. The gate of the transistor 233 can be coupled with the output end 210a of the LC tank circuit 210. An output end 230a of the peak detector 230 can be disposed between the transistor 233 and the capacitor 235. As noted, the peak detector 230 can detect the peak voltage of the output signal 211. The peak detector 230 can output a signal 231 corresponding to the amplitude plus its DC voltage level of the output signal 211. The amplitude plus the DC voltage level is also denoted as the peak voltage. In some embodiments, the signal 231 can carry a voltage state that is substantially equal to the peak voltage of the output signal 211. The signal 231 can be output to the comparators 243a and 243b and then to the charge pump circuit 240.

In some embodiments, the peak detector 230 can optionally include another transistor 237, e.g., an NMOS transistor. The gate of the transistor 237 can be coupled with a bias voltage $V_b$. The bias voltage $V_b$ may slightly turn on the transistor 237 for providing a discharge path such that charges accumulated on the capacitor 235 due to transistor leakage from transistor 233 can be desirably released. It is noted that the type and/or disposition of the transistors 233, 237 and the capacitor 235 of the peak detector 230 are merely exemplary. The scope of the disclosure is not limited thereto.

The comparators 243a and 243b can be coupled with the output end 230a of the peak detector 230, receiving the signal 231. The peak detector 230 can detect the peak voltage of the output signal 211. The comparators 243a and 243b and the charge pump circuit 240 can determine if the peak voltage of the output signal 211 falls within the range between the voltage levels $V_1$ and $V_2$. If the peak voltage of the output signal 211 falls within the range, the feedback loop 220 can be free from outputting a signal for adjusting the amplitude of the output signal 211. If the peak voltage of the output signal 211 falls outside the range, the feedback loop 220 can output a signal 221 for adjusting the amplitude of the output signal 211.

Referring to FIG. 2, the charge pump circuit 240 can include transistors 245a-245b, current sources 247a-247b, and a capacitor 253. The transistors 245a and 245b, e.g., a PMOS transistor and an NMOS transistor, respectively, can be coupled with the comparators 243a and 243b, respectively. The current source 247a can be disposed between the transistor 245a and a voltage source, e.g., VDD. The current source 247b can be disposed between the transistor 245b and another voltage source, e.g., VSS. An output end 240a of the charge pump circuit 240 can be disposed between the transistors 245a and 245b.

In some embodiments, the integrated circuit 200 can include another current source 250, e.g., a biased-NMOS transistor, coupled with the cross-coupled transistors 213a-213b. The current source 250 can be coupled with the output end 240a of the charge pump circuit 240. The current source 250 can be coupled with the cross-coupled transistors 213a-213b and parallel with the current source 215. The current source 250 can be coupled with the charge pump capacitor 253. In some embodiments using a transistor, the capacitor 253 can be coupled with the gate of the current source 250.

As noted, the signal 231 can carry a voltage level that is substantially equal to the peak voltage of the output signal 211. The comparator 243a can compare the peak voltage of the output signal 211 with the voltage level $V_1$. The comparator 243b can compare the peak voltage of the output signal 211 with the voltage level $V_2$. In some embodiments using a 1.8-V VDD power source, the common mode voltage of the output signal 211 can be about 0.9 V. The voltage level $V_1$ can be about 1.2 V and the voltage level $V_2$ can be about 1.6 V. It is noted that the voltage levels described above are merely exemplary. They may be modified in view of the power sources and desired oscillation amplitudes.

In some embodiments, if the peak voltage of the output signal 211 is between the voltage levels $V_1$ and $V_2$, e.g., 1.2 V and 1.6 V, the comparators 243a and 243b can output signals to turn off the transistors 245a and 245b. The turned-off transistors 245a and 245b can substantially isolate the output end 240a from the power sources VDD and VSS and the current sources 247a and 247b. The current source 250 can be controlled by the existing voltage stored on the capacitor 253. The charge pump circuit 240 can be free from adjusting the amplitude of the output signal 211.

In other embodiments, if the peak voltage of the output signal 211 is smaller than the voltage level $V_1$, e.g., 1.2 V, the comparators 243a can output a signal to turn on the transistor 245a and the comparator 243b can output another signal to turn off the transistor 245b. The turned-on transistor 245a can couple the output end 240a with the power source VDD through the current source 247a. The output end 240a can output a signal 221, e.g., a voltage signal, to the gate of the current source 250 and the capacitor 253. The signal 221 can pull up a voltage level at the gate of the current source 250 and the capacitor 253. The signal 221 can desirably increase the gate bias of the current source 250 so as to increase the total tail current and the current flowing through the cross-coupled transistors 213a-213b. By increasing the total tail current, the gain of the cross-coupled transistors can be increased such that the amplitude of the output signal 211 at the output end 210a can be desirably increased.

In still other embodiments, if the peak voltage of the output signal 211 is larger than the voltage state $V_2$, e.g., 1.6 V, the comparators 243a can output a signal to turn off the transistor 245a and the comparator 243b can output another signal to turn on the transistor 245b. The turned-on transistor 245b can couple the output end 240a with the power source VSS through the current source 247b. The output end 240a can output the signal 221, e.g., a voltage signal, to the gate of the current source 250 and the capacitor 253. The signal 221 can pull down a voltage state at the gate of the current source 250 and the capacitor 253. The signal 221 can desirably decrease the gate bias of the current source 250, decreasing the total tail current and the current flowing through the cross-coupled transistors 213a-213b. By decreasing the total tail current, the amplitude of the output signal 211 at the output end 210a can be desirably decreased.

It is noted that the feedback loop 220 described above in conjunction with FIG. 2 can be coupled with the output end 210a of the LC tank circuit 210. In other embodiments, the LC tank circuit 210 can have another output end (not shown) that is opposite to the output end 210a. The feedback loop 220 can be coupled with the output end. In this embodiment, the type of the transistors, values of the voltage levels $V_1$ and $V_2$, value of the power source VDD, and/or dispositions of the components of the feedback loop 220 may be modified. One skilled in the art can understand how to modify the feedback loop in view of the embodiments described above in conjunction with FIG. 2.

Following are descriptions regarding embodiments for adjusting the common mode voltage of the output signal 211. Referring again to FIG. 2, the integrated circuit 200 can include a resistor $R_1$ coupled with the LC tank circuit 210 and the power source VDD. The resistor $R_1$ can be configured for adjusting the common mode voltage of the output signal 211. In some embodiments, the integrated circuit 200 can include a voltage control resistor 260 coupled with the power source VDD and be parallel with the resistor $R_1$. The integrated circuit 200 can include transistors 263 and 265, e.g., a PMOS transistor and an NMOS transistor, respectively, coupled with each other. The gate and drain of the transistor 263 can be coupled with the voltage control resistor 260. The gate of the transistor 265 can be coupled with the output end 240a of the charge pump circuit 240. In some embodiments, the integrated circuit 200 can optionally include another resistor $R_2$ coupled with voltage control resistor 260 in series.

Following is description regarding methods for adjusting the common mode voltage of the output signal 211. As noted, if the peak voltage of the output signal 211 is smaller than the voltage level $V_1$, e.g., 1.2 V, the total tail current flowing through the cross-coupled transistors 213a-213b can be increased. A current flowing through the transistors 263 and 265 is increased, too. A current flowing through the voltage control resistor 260 can also be increased. The increase of the current flow can reduce the resistance of the voltage control resistor 260. The equivalent resistance of the resistors $R_1$ and $R_2$ and the voltage control resistor 260 can be decreased. The decreased equivalent resistance can desirably adjust the common mode voltage of the output signal 211 at the output end 210a of the LC tank circuit 210. In some embodiments using a 1.8-V VDD power source, the common mode voltage of the output signal 211 can be increased toward to, e.g., 0.9 V.

If the peak voltage of the output signal 211 is larger than the voltage level $V_2$, e.g., 1.6 V, the total tail current flowing through the cross-coupled transistors 213a-213b can be decreased. A current flowing through the transistors 263 and 265 is decreased, too. A current flowing through the voltage control resistor 260 can also be decreased. The decrease of the current flow can increase the resistance of the voltage control resistor 260. The equivalent resistance of the resistors $R_1$ and $R_2$ and the voltage control resistor 260 can be increased. The increased equivalent resistance can desirably adjust the common mode voltage of the output signal 211 at the output end 210a of the LC tank circuit 210. In some embodiments using a 1.8-V VDD power source, the common mode voltage of the output signal 211 can be decreased toward to, e.g., 0.9 V. From the foregoing, the common mode voltage of the output signal 211 can be adjusted by adjusting the resistance of the voltage control resistor.

Figure 3:
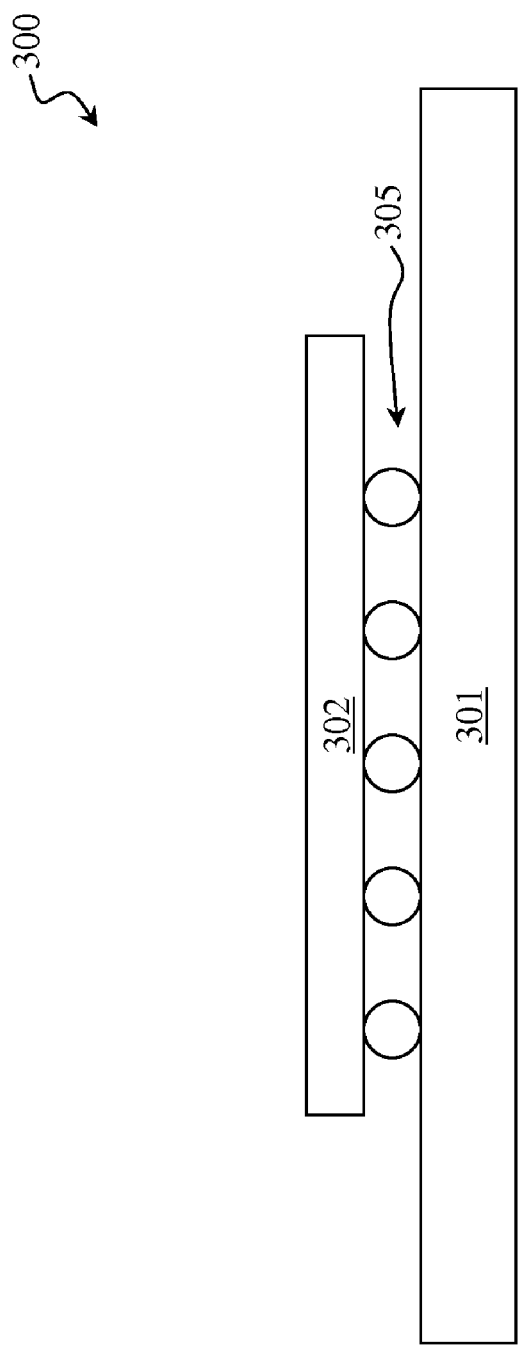
FIG. 3 is a schematic drawing illustrating a system including an exemplary integrated circuit disposed over a substrate board.

FIG. 3 is a schematic drawing illustrating a system including an exemplary integrated circuit disposed over a substrate board. In FIG. 3, a system 300 can include an integrated circuit 302 disposed over a substrate board 301. The substrate board 301 can include a printed circuit board (PCB), a printed wiring board and/or other carrier that is capable of carrying an integrated circuit. The integrated circuit 302 can include an LC tank circuit and be similar to the integrated circuit 100 or 200 described above in conjunction with FIGS. 1 and 2, respectively. The integrated circuit 302 can be electrically coupled with the substrate board 301. In some embodiments, the integrated circuit 302 can be electrically coupled with the substrate board 301 through bumps 305. In other embodiments, the integrated circuit 302 can be electrically coupled with the substrate board 301 through wire bonding. The system 300 can be part of an electronic system such as computers, wireless communication devices, computer-related peripherals, entertainment devices, or the like.

In some embodiments, the system 300 including the integrated circuit 302 can provides an entire system in one IC, so-called system on a chip (SOC) or system on integrated circuit (SOIC) devices. These SOC devices may provide, for example, all of the circuitry needed to implement a radio system, a television, a video apparatus, a satellite broadcast system, an instrumentation system, a cell phone, personal data assistant (PDA), digital VCR, digital camcorder, digital camera, MP3 player, or the like in a single integrated circuit.

From the foregoing, a first embodiment provides an integrated circuit. The integrated circuit includes an inductor-capacitor (LC) tank circuit coupled with a feedback loop. The LC tank circuit is configured to output an output signal having a peak voltage that is substantially equal to an amplitude plus a direct current (DC) voltage value. The feedback loop can determine if the peak voltage of the output signal falls within a range between a first voltage level and a second voltage level for adjusting the amplitude of the output signal.

In the other embodiment, a method for adjusting an amplitude of an output signal from an inductor-capacitor (LC) tank circuit is provided. The method includes detecting a peak voltage of the output signal at an output end of the LC tank circuit. The peak voltage of the output signal is determined if the peak voltage falls within a range between a first voltage level and a second voltage level for adjusting the amplitude of the output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
an inductor-capacitor (LC) tank circuit, the LC tank circuit being configured to output an output signal having a peak voltage that is substantially equal to an amplitude plus a direct current (DC) voltage value; and
a feedback loop coupled with the LC tank circuit, wherein the feedback loop is capable of determining if the peak voltage of the output signal falls within a range between a first voltage level and a second voltage level for adjusting the amplitude of the output signal, the first voltage level being smaller than the second voltage level, wherein
if the peak voltage of the output signal is within the range, the feedback loop outputs no feedback signal,
if the peak voltage of the output signal is smaller than the first voltage level, the feedback loop outputs a feedback signal for increasing the amplitude of the output signal, and
if the peak voltage of the output signal is larger than the second voltage level, the feedback loop outputs a feedback signal for decreasing the amplitude of the output signal.

2. The integrated circuit of claim 1, wherein the feedback loop comprises:
a peak detector coupled with the LC tank circuit;
at least one comparator coupled with the peak detector; and
a charge pump circuit coupled with the at least one comparator.

3. The integrated circuit of claim 2 further comprising:
a resistor coupled with the LC tank circuit, wherein the resistor is configured for adjusting a common mode voltage of the output signal;
a voltage control resistor coupled with the LC tank circuit, wherein the voltage control resistor is parallel with the resistor; and
a first transistor coupled with the voltage control resistor, wherein the first transistor is coupled with the charge pump circuit.

4. The integrated circuit of claim 3, wherein the voltage control resistor is adjustable for adjusting the common mode voltage of the output signal.

5. The integrated circuit of claim 2 further comprising:
cross-coupled transistors coupled with the LC tank circuit;
a first current source coupled with the cross-coupled transistors; and
a second current source coupled with the cross-coupled transistors and the charge pump circuit.

6. The integrated circuit of claim 2, wherein the peak detector comprises:
a transistor, wherein a gate of the transistor coupled with the LC tank circuit; and
a capacitor coupled with the transistor, wherein an output end of the peak detector is between the transistor and the capacitor and is coupled with the at least one comparator.

7. The integrated circuit of claim 6, wherein the at least one comparator comprises:
a first comparator coupled with the output end of the peak detector, wherein the first comparator is capable of comparing the peak voltage of the output signal with the first voltage level; and
a second comparator coupled with the output end of the peak detector, wherein the second comparator is capable of comparing the peak voltage of the output signal with the second voltage level.

8. The integrated circuit of claim 5, wherein the charge pump circuit comprises:
- a first transistor coupled with the first comparator;
- a third current source coupled between the first transistor and a first power voltage source;
- the second transistor coupled with the second comparator, wherein an output end of the charge pump circuit is between the first transistor and the second transistor and the output end of the charge pump circuit is coupled with the second current source; and
- a fourth current source coupled between the second transistor and a second power voltage source.

9. An integrated circuit comprising:
- an inductor-capacitor (LC) tank circuit configured to output an output signal having a peak voltage that is substantially equal to an amplitude plus a direct current (DC) voltage value;
- cross-coupled transistors coupled with the LC tank circuit, the cross-coupled transistors providing a gain to the LC tank circuit;
- a first current source coupled with the cross-coupled transistors;
- a peak detector coupled with the LC tank circuit, the peak detector detecting a peak voltage of the output signal;
- a pair of comparators coupled with the peak detector, including a first comparator that compares the peak voltage of the output signal with a first voltage level and a second comparator that compares the peak voltage of the output signal with a second voltage level, the first voltage level being smaller than the second voltage level; and
- a charge pump circuit coupled with the pair of the comparators, wherein
- if the peak voltage of the output signal is within a range between the first voltage level and the second voltage level, the pair of comparators output signals by which the charge pump circuit outputs no signal,
- if the peak voltage of the output signal is smaller than the first voltage level, the pair of comparators output signals by which the charge pump circuit outputs a signal for increasing the amplitude of the output signal, and
- if the peak voltage of the output signal is larger than the second voltage level, the pair of comparators output signals by which the charge pump circuit outputs a signal for decreasing the amplitude of the output signal.

10. The integrated circuit of claim 9 further comprising:
- a second current source coupled with the cross-coupled transistors and the charge pump circuit.

11. The integrated circuit of claim 9, wherein the peak detector comprises:
- a first transistor, wherein a gate of the first transistor coupled with the LC tank circuit; and
- a capacitor coupled with the first transistor, wherein an output end of the peak detector is between the first transistor and the capacitor and is coupled with the pair of comparators.

12. The integrated circuit of claim 9, wherein the charge pump circuit comprises:
- a first transistor coupled with the first comparator;
- a second current source coupled between the transistor and a first power voltage source;
- a second transistor coupled with the second comparator, wherein an output end of the charge pump circuit is between the first transistor and the second transistor and the output end of the charge pump circuit is coupled with the second current source; and
- a fourth current source coupled between the second transistor and a second power voltage source.

13. The integrated circuit of claim 9 further comprising:
- a resistor coupled with the LC tank circuit, wherein the resistor is configured for adjusting a common mode voltage of the output signal;
- a voltage control resistor coupled with the LC tank circuit, wherein the voltage control resistor is parallel with the resistor; and
- a first transistor coupled with the voltage control resistor, wherein the fourth transistor is coupled with the charge pump circuit.

14. A method for adjusting an amplitude of an output signal from an inductor-capacitor (LC) tank circuit, the method steps comprising:
- detecting a peak voltage of the output signal at an output end of the LC tank circuit, wherein the peak voltage is substantially equal to an amplitude plus a direct current (DC) voltage value;
- comparing the peak voltage of the output signal with a first voltage level and a second voltage level; and
- adjusting the amplitude of the output signal based on a result of the comparing, wherein
- if the peak voltage of the output signal is within a range between the first voltage level and the second voltage level, the adjusting includes outputting no signal to adjust the amplitude of the output signal,
- if the peak voltage of the output signal is smaller than the first voltage level, the adjusting includes outputting a first signal for increasing the amplitude of the output signal, and
- if the peak voltage of the output signal is larger than the second voltage level, the adjusting includes outputting a second signal for decreasing the amplitude of the output signal.

15. The method of claim 14, wherein
- the adjusting includes adjusting a tail current flowing through the LC tank circuit,
- if the peak voltage of the output signal is smaller than the first voltage level, the outputting a first signal includes outputting a signal for increasing the tail current, and
- if the peak voltage of the output signal is larger than the second voltage level, the outputting a second signal includes outputting a signal for decreasing the tail current.

16. The method of claim 14 further comprising:
- adjusting a resistance of a voltage control resistor coupled with the LC tank circuit for adjusting a common mode voltage of the output signal.

* * * * *